(12) United States Patent
Choe et al.

(10) Patent No.: US 12,250,009 B2
(45) Date of Patent: Mar. 11, 2025

(54) INTERFACE DEVICE SUPPORTING TEST OPERATION

(71) Applicant: SK hynix Inc., Gyeonggi-do (KR)

(72) Inventors: Eun Ju Choe, Gyeonggi-do (KR); Ho Young Park, Gyeonggi-do (KR); Jong Hwan Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 217 days.

(21) Appl. No.: 18/183,952

(22) Filed: Mar. 15, 2023

(65) Prior Publication Data

US 2024/0146329 A1    May 2, 2024

(30) Foreign Application Priority Data

Oct. 27, 2022   (KR) .................. 10-2022-0140121

(51) Int. Cl.
*H03M 9/00*      (2006.01)
*H04L 27/26*     (2006.01)

(52) U.S. Cl.
CPC .......... *H03M 9/00* (2013.01); *H04L 27/2647* (2013.01)

(58) Field of Classification Search
CPC ...................................................... H03M 9/00
USPC .................................... 341/10, 101, 100, 51
See application file for complete search history.

(56) References Cited

U.S. PATENT DOCUMENTS

| | | | |
|---|---|---|---|
| 5,151,700 A * | 9/1992 | Matsuzawa ........... | H03M 1/146 341/155 |
| 10,437,744 B2 | 10/2019 | Song et al. | |
| 11,740,958 B2 * | 8/2023 | Das Sharma ....... | G06F 13/4291 714/776 |
| 2019/0141553 A1 * | 5/2019 | Mueck .................. | H04L 43/50 |

FOREIGN PATENT DOCUMENTS

KR    10-2250493 B1    5/2021

* cited by examiner

*Primary Examiner* — Peguy Jean Pierre
(74) *Attorney, Agent, or Firm* — IP & T GROUP LLP

(57) ABSTRACT

Disclosed is an interface circuit including a first parallel-to-serial conversion circuit suitable for converting inverted parallel data in a parallel-to-serial manner to generate first output data in a test mode; a second parallel-to-serial conversion circuit suitable for converting non-inverted parallel data in the parallel-to-serial manner to generate second output data in the test mode; a third parallel-to-serial conversion circuit suitable for converting the non-inverted parallel data in the parallel-to-serial manner to generate third output data in the test mode; a fourth parallel-to-serial conversion circuit suitable for converting the inverted parallel data in the parallel-to-serial manner to generate fourth output data in the test mode; a first driver circuit suitable for receiving the first and second output data in the test mode; and a second driver circuit suitable for receiving the third and fourth output data in the test mode.

13 Claims, 7 Drawing Sheets

INTERFACE DEVICE SUPPORTING TEST OPERATION

CROSS-REFERENCE TO RELATED APPLICATIONS

This application claims priority under 35 U.S.C. § 119 to Korean Patent Application No. 10-2022-0140121, filed on Oct. 27, 2022, the disclosure of which is incorporated herein by reference in its entirety.

BACKGROUND

1. Field

Various embodiments of the present disclosure relate to a complementary metal oxide semiconductor (CMOS) image sensor (CIS).

2. Description of the Related Art

Recently, CMOS image sensors (CISs) are required to reduce power consumption while processing high-resolution image information at high speed.

In addition, interface protocols suitable for connecting the CMOS image sensor and a processor such as an application processor (AP), has also been developing, and representative examples thereof include a display serial interface-PHY (D-PHY) and a camera serial interface-PHY (C-PHY) which are physical layer (PHY) protocol standards developed by the mobile industry processor interface (MIPI) alliance.

D-PHY consists of one clock lane and a maximum of four data lanes and each lane outputs a differential signal, and accordingly the D-PHY uses a total of ten lines to transmit and receive signals. C-PHY, which is an improvement of the D-PHY, has only a maximum of three data lanes, and uses three lines per lane unlike the D-PHY. The C-PHY does not provide a separate clock lane. Instead, a clock is embedded in transmitted data, and a module that finds the embedded clock is used by the side which receives the data.

Since the interface protocol used varies depending on systems operating the CMOS image sensor, the CMOS image sensor is configured to support both of D-PHY and C-PHY and one of the interface protocols may be selected and used depending on system settings, and such a method is referred to as a combo-PHY.

Since D-PHY and C-PHY are different in a connection method and a signal transmission method, there is also a difference in a signal path and a circuit used by each of the D-PHY and the C-PHY. Therefore, in order to test an operation of an interface device supporting the combo-PHY, the D-PHY and C-PHY have to be verified respectively. To this end, one test equipment should support both of the D-PHY and the C-PHY, or D-PHY test equipment and C-PHY test equipment should be prepared separately. When only one of two interfaces is tested, a signal path and a circuit used only by the other interface cannot be tested, thus even though there is a defect in a corresponding area, the defect cannot be detected.

SUMMARY

Various embodiments of the present disclosure are directed to a test mode circuit that allows an interface device supporting two or more different interface protocols to test, by using one interface protocol, signal paths and circuits used by other interface protocols.

In accordance with an embodiment of the present disclosure, an interface device may include: a first parallel-to-serial conversion circuit suitable for converting inverted parallel data in a parallel-to-serial manner to generate first output data in a test mode; a second parallel-to-serial conversion circuit suitable for converting non-inverted parallel data in the parallel-to-serial manner to generate second output data in the test mode; a third parallel-to-serial conversion circuit suitable for converting the non-inverted parallel data in the parallel-to-serial manner to generate third output data in the test mode; a fourth parallel-to-serial conversion circuit suitable for converting the inverted parallel data in the parallel-to-serial manner to generate fourth output data in the test mode; a first driver circuit suitable for receiving the first and second output data in the test mode; and a second driver circuit suitable for receiving the third and fourth output data in the test mode.

In accordance with an embodiment of the present disclosure, an interface device supporting first and second interface protocols may include: a digital physical layer (PHY) configured to receive parallel data; and an analog PHY configured to provide the parallel data transmitted from the digital PHY with different serialized data paths corresponding to first and second operation modes, wherein the digital PHY includes: a first PHY logic configured to modify the received parallel data according to the first interface protocol, in the first operation mode; a second PHY logic configured to modify the received parallel data according to the second interface protocol, in the second operation mode; and a test logic configured to receive, in a test mode, the parallel data according to the first interface protocol, and supply all data paths in the analog PHY with a test parallel data pattern, the all data paths including at least a data path which is only used in the second operation mode.

DETAILED DESCRIPTION

In describing the present disclosure, detailed descriptions of publicly-known technologies related to the present disclosure will be omitted so as not to obscure the subject matter of the present disclosure. Various embodiments are described below with reference to the accompanying drawings, in order to describe in detail the present disclosure so that those with ordinary skill in art to which the present disclosure pertains may easily carry out the technical spirit of the present disclosure.

It will be understood that when an element is referred to as being "connected to" or "coupled to" another element, the element may be directly connected to or coupled to the another element, or electrically connected to or coupled to the another element with one or more elements interposed therebetween. In addition, it will also be understood that the terms "comprises," "comprising," "includes," and "including" when used in this specification do not preclude the presence of one or more other elements, but may further include or have the one or more other elements, unless stated otherwise. In the description throughout the specification, some components are described in singular forms, but the present disclosure is not limited thereto, and it will be understood that the components may be formed in plural.

Figure 1:
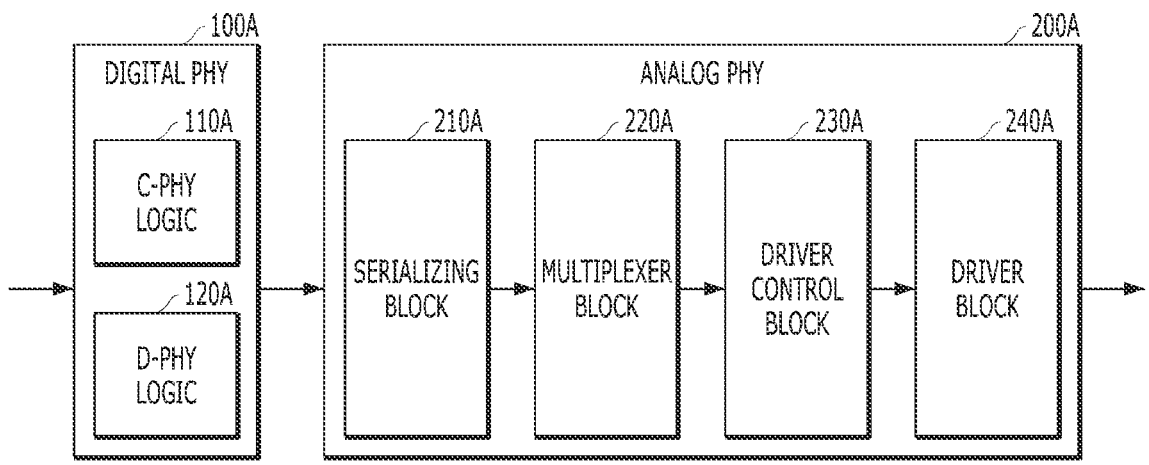
FIG. 1 is a block diagram illustrating an interface supporting combo-PHY in accordance with an embodiment of the present disclosure.

FIG. 1 is a block diagram illustrating an interface device 10A supporting combo-PHY in accordance with an embodiment of the present disclosure.

As illustrated in FIG. 1, the interface device 10A may include a digital PHY 100A and an analog PHY 200A.

The digital PHY 100A may include a C-PHY logic 110A and a D-PHY logic 120A, and output received parallel data in a parallel data format modified according to a selected interface protocol. For example, when the digital PHY 100A operates in a C-PHY mode, the C-PHY logic 110A may be activated, and the digital PHY 100A may modify the received parallel data for a C-PHY protocol and output the modified data in the parallel data format. On the other hand, when the digital PHY 100A operates in a D-PHY mode, the D-PHY logic 120A may be activated, and the digital PHY 100A may modify the received parallel data for a D-PHY protocol and output the modified data in the parallel data format.

The analog PHY 200A may include a serializing block 210A, a multiplexer block 220A, a driver control block 230A and a driver block 240A. The serializing block 210A may receive the parallel data from the digital PHY 100A, convert the received parallel data in a parallel-to-serial manner, and output the converted data in a serial data format. The multiplexer block 220A may transmit the serial data received from the serializing block 210A to the driver control block 230A through a path selected according to the selected interface protocol. The driver control block 230A may generate a control signal for controlling the driver block 240A according to the received serial data. The driver block 240A may output the serial data according to the control signal received from the driver control block 230A.

Figure 2:
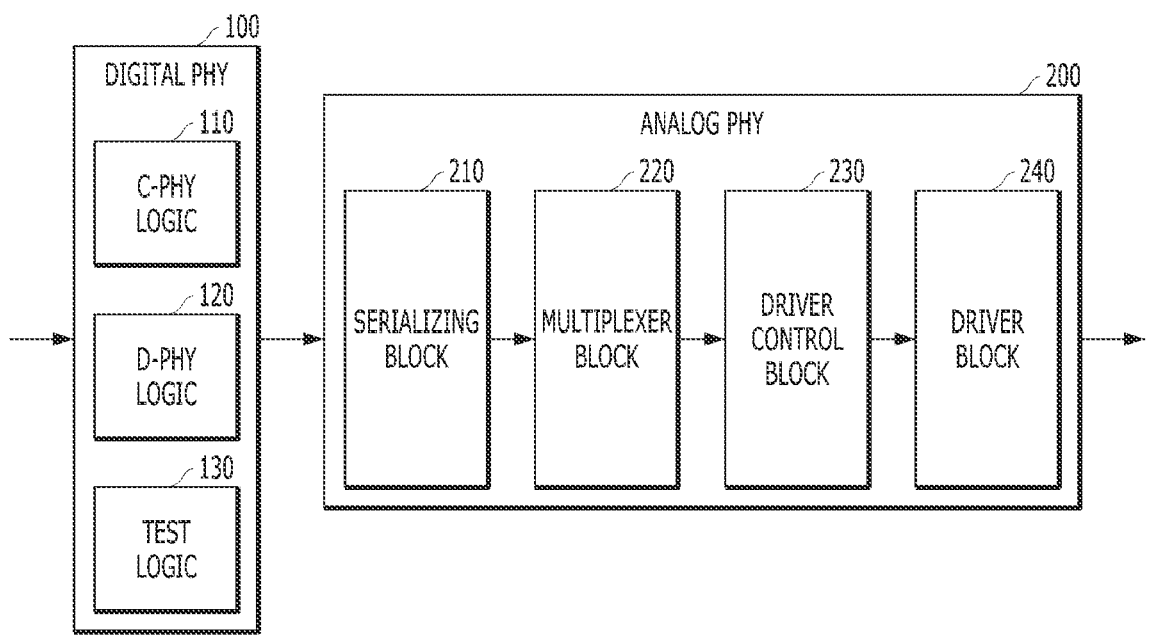
FIG. 2 is a block diagram illustrating an interface in accordance with an embodiment of the present disclosure.

FIG. 2 is a block diagram illustrating an interface device 10 in accordance with an embodiment of the present disclosure.

The interface device 10 illustrated in FIG. 2 may include a digital PHY 100 and an analog PHY 200.

The digital PHY 100 may include a C-PHY logic 110, a D-PHY logic 120 and a test logic 130. The C-PHY logic 110 and the D-PHY logic 120 may correspond to the C-PHY logic 110A and the D-PHY logic 120A, respectively, described with reference to FIG. 1.

The test logic 130 may be activated during a test mode operation, convert received parallel data in a parallel data format for a test operation, and output the converted data.

The analog PHY 200 may include a serializing block 210, a multiplexer block 220, a driver control block 230 and a driver block 240.

The serializing block 210, the multiplexer block 220, the driver control block 230 and the driver block 240 may correspond to the serializing block 210A, the multiplexer block 220A, the driver control block 230A and the driver block 240A, respectively, described with reference to FIG. 1.

Figure 3:
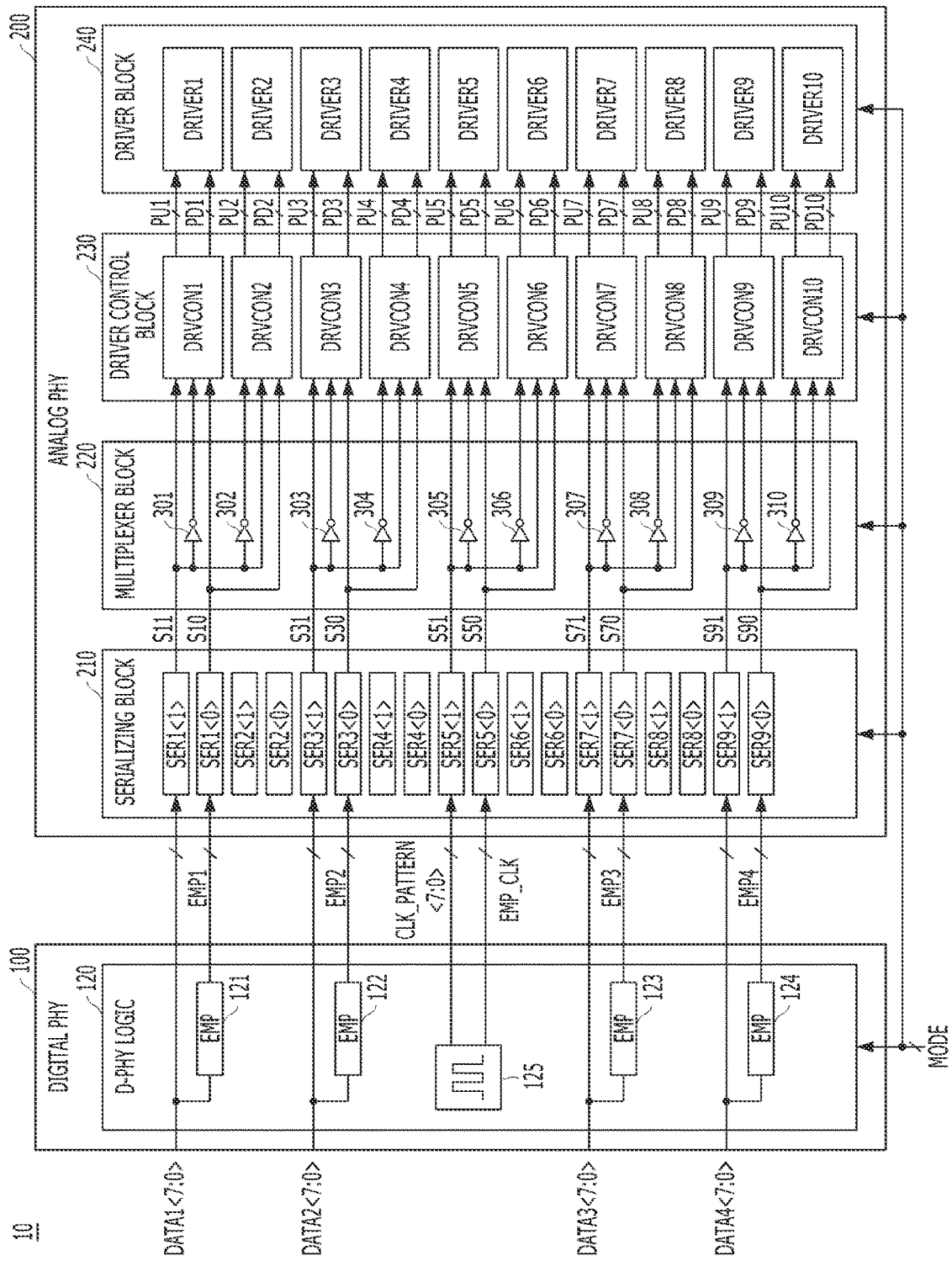
FIG. 3 is a diagram for describing a D-PHY mode operation of the interface illustrated in FIG. 2 in accordance with an embodiment of the present disclosure.

FIG. 3 is a diagram for describing a D-PHY mode operation of the interface device 10 illustrated in FIG. 2 in accordance with an embodiment of the present disclosure.

Since the C-PHY logic 110 and the test logic 130 included in the digital PHY 100 are deactivated or disabled during the D-PHY mode operation, illustrations thereof are omitted in FIG. 3.

The digital PHY 100 may receive mode information MODE composed of one or more bits, and select one operation mode of the D-PHY mode, the C-PHY mode and the test mode.

During the D-PHY mode operation, the C-PHY logic 110 and the test logic 130 may be deactivated according to the mode information MODE.

During the D-PHY mode operation, the D-PHY logic 120 included in the digital PHY 100 may be activated according to the mode information MODE, and receive parallel data DATA1<7:0>, DATA2<7:0>, DATA3<7:0> and DATA4<7:0> to be outputted to an external device.

A D-PHY interface protocol may be composed of one clock lane and a maximum of four data lanes. FIG. 3 illustrates a case in which the D-PHY interface protocol is composed of four data lanes, and the number of data lanes may be less than four according to various embodiments.

The D-PHY logic 120 may receive the parallel data DATA1<7:0> to DATA4<7:0>. Each of the parallel data DATA1<7:0> to DATA4<7:0> may be 8-bit data to be outputted to one data lane.

The D-PHY logic 120 may include emphasis circuits (EMPs) 121 to 124 that generate emphasis information EMP1 to EMP4, respectively, for each data lane. The emphasis circuits 121 to 124 may generate the emphasis information EMP1 to EMP4, respectively, in parallel for adjusting a driving force of final output signals according to values of the inputted parallel data. For example, the emphasis circuit 121 may generate the emphasis information EMP1 for an emphasis operation on the parallel data DATA1<7:0>, and the emphasis circuit 123 may generate the emphasis information EMP3 for the emphasis operation on the parallel data DATA3<7:0>. Types of the emphasis operation may include a de-emphasis operation and/or a pre-emphasis operation.

The emphasis circuits 121 to 124 may be activated/deactivated according to whether to perform the emphasis operation.

During the D-PHY mode operation, the digital PHY 100 may receive the parallel data DATA1<7:0> to DATA4<7:0> through the respective data lanes, and output the parallel data DATA1<7:0> to DATA4<7:0> and the emphasis information EMP1 to EMP4 corresponding to the parallel data DATA1<7:0> to DATA4<7:0>, respectively.

The D-PHY logic 120 may further include a clock pattern generation circuit 125 for outputting a clock signal. The clock pattern generation circuit 125 may output clock patterns CLK_PATTERN<7:0> in parallel and emphasis information EMP_CLK for the clock patterns CLK_PATTERN<7:0>.

The analog PHY 200 may include the serializing block 210, the multiplexer block 220, the driver control block 230 and the driver block 240.

The analog PHY 200 may receive the mode information MODE, and select one operation mode of the D-PHY mode, the C-PHY mode and the test mode.

During the D-PHY mode operation, the serializing block 210, the multiplexer block 220, the driver control block 230 and the driver block 240 are configured to output data using a D-PHY protocol according to the mode information MODE.

The serializing block 210 may include 18 parallel-to-serial conversion circuits SER1<1> to SER9<1> and SER1<0> to SER9<0>. When the D-PHY mode is selected according to the mode information MODE, among the 18 parallel-to-serial conversion circuits SER1<1> to SER9<1> and SER1<0> to SER9<0> of the serializing block 210, 10 parallel-to-serial conversion circuits SER1<1>, SER1<0>, SER3<1>, SER3<0>, SER5<1>, SER5<0>, SER7<1>, SER7<0>, SER9<1> and SER9<0> may be activated, and the other 8 parallel-to-serial conversion circuits SER2<1>, SER2<0>, SER4<1>, SER4<0>, SER6<1>, SER6<0>, SER8<1> and SER8<0> may be deactivated.

The activated parallel-to-serial conversion circuits SER1<1>, SER1<0>, SER3<1>, SER3<0>, SER5<1>, SER5<0>, SER7<1>, SER7<0>, SER9<1> and SER9<0> may receive the parallel data DATA1<7:0> to DATA4<7:0>, the clock patterns CLK_PATTERN<7:0> and the emphasis information EMP1 to EMP4 and EMP_CLK, convert the parallel data DATA1<7:0> to DATA4<7:0>, the clock patterns CLK_PATTERN<7:0> and the emphasis information EMP1 to EMP4 and EMP_CLK at a ratio of 8:1 in a parallel-to-serial manner. For example, an output S11 of the parallel-to-serial conversion circuit SER1<1> may be a result of the parallel-to-serial conversion of the parallel data DATA1<7:0> at the ratio of 8:1, and an output S10 of the parallel-to-serial conversion circuit SER1<0> may be a result of the parallel-to-serial conversion of the emphasis information EMP1 at the ratio of 8:1.

During the D-PHY mode operation, the multiplexer block 220 may receive the outputs S11, S10, S31, S30, S51, S50, S71, S70, S91 and S90 of the serializing block 210, and set signal paths so that each of the data lanes and the clock lane are outputted in a differential signal format. The multiplexer block 220 may invert some of the outputs of the serializing block 210 by using inverters 301 to 310 therein, and transmit the inverted outputs to the driver control block 230. For example, a driver control circuit DRVCON1 may receive the output S11 of the parallel-to-serial conversion circuit SER1<1>, the inverted output S11 outputted from the inverter 301, and the output S10 of the parallel-to-serial conversion circuit SER1<0>. Likewise, a driver control circuit DRVCON4 may receive the output S31 of the parallel-to-serial conversion circuit SER3<1>, the inverted output S31 outputted from the inverter 304, and the output S30 of the parallel-to-serial conversion circuit SER3<0>.

The driver control block 230 may include 10 driver control circuits DRVCON1 to DRVCON10.

During the D-PHY mode operation, all of the 10 driver control circuits DRVCON1 to DRVCON10 of the driver control block 230 may be activated.

The driver control circuits DRVCON1 to DRVCON10 may each receive a pair of serial data in the differential signal format from the multiplexer block 230, and convert the received serial data into a plurality of pull-up signals PU1 to PU10 and a plurality of pull-down signals PD1 to PD10, respectively. In addition, the driver control circuits DRVCON1 to DRVCON10 may reflect (e.g., add) the emphasis information transmitted from the multiplexer block 230 into the pull-up signals PU1 to PU10 and the pull-down signals PD1 to PD10 so that a driving force of data outputted from the driver block 240 is adjusted. For example, the driver control circuit DRVCON7 may determine a logic level of data outputted from a driver circuit DRIVER7 in response to differential data (i.e., the serial data S71 outputted from the parallel-to-serial conversion circuit SER7<1> and the inverted serial data S71 outputted from the inverter 307), determine a driving force of the driver circuit DRIVER7 by using emphasis information EMP3 outputted from the parallel-to-serial conversion circuit SER7<0>, and generate the pull-up signal PU7 and the pull-down signal PD7 according to the determination result.

The driver block 240 may include 10 driver circuits DRIVER1 to DRIVER10.

During the D-PHY mode operation, all of the 10 driver circuits DRIVER1 to DRIVER10 included in the driver block 240 may be activated.

The driver circuits DRIVER1 to DRIVER10 may be controlled by respective pull-up and pull-down signals among the pull-up signals PU1 to PU10 and the pull-down signals PD1 to PD10 to output data. For example, a logic level of data outputted from the driver circuit DRIVER10 and the driving force thereof may be determined according to the pull-up signal PU10 and the pull-down signal PD10.

Figure 4:
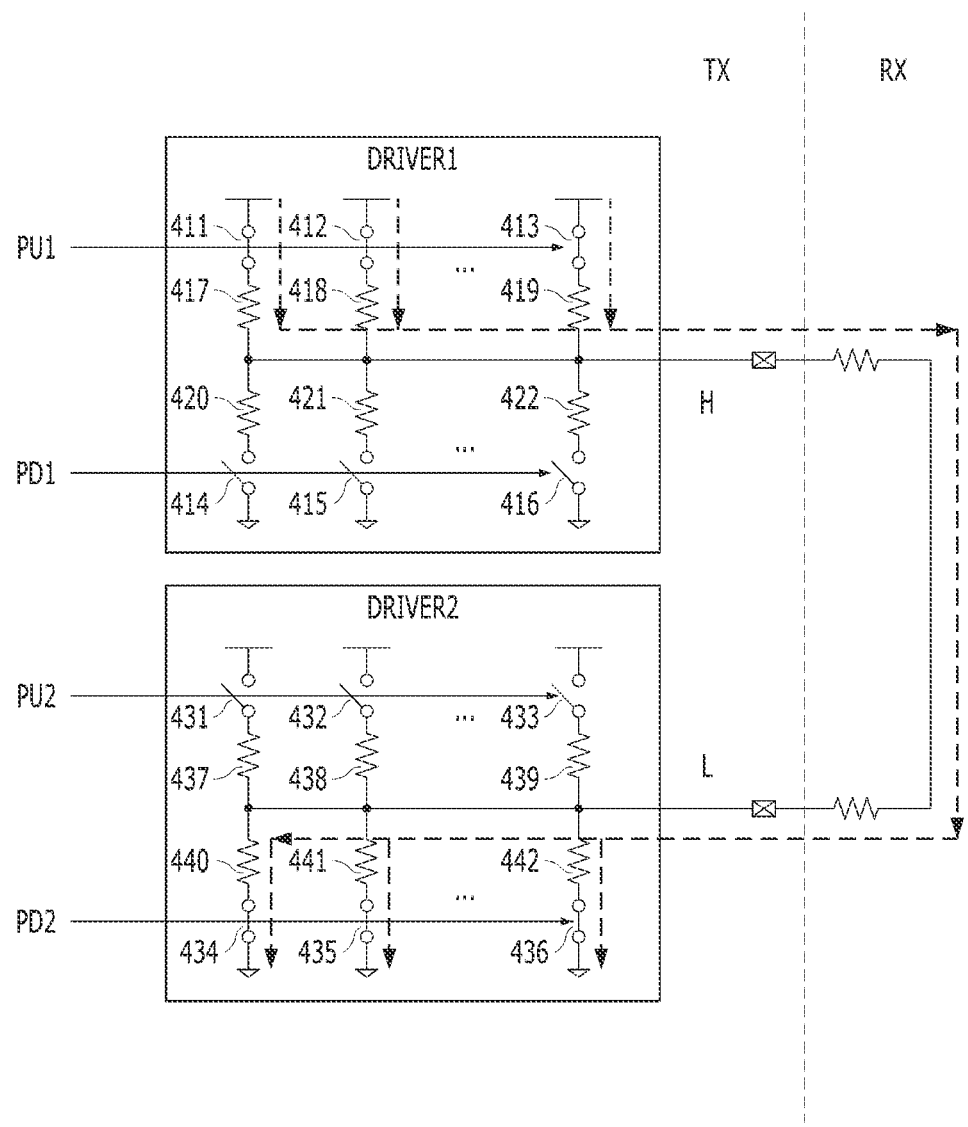
FIG. 4 is a diagram for describing an operation of a driver block in a D-PHY mode illustrated in FIG. 3 in accordance with an embodiment of the present disclosure.

FIG. 4 is a diagram for describing an operation of the driver block 240 in the D-PHY mode illustrated in FIG. 3 in accordance with an embodiment of the present disclosure. The operation of the driver block 240 is described below using the driver circuits DRIVER1 and DRIVER2 as an example.

The driver circuit DRIVER1 may include a plurality of pull-up switches 411 to 413, a plurality of pull-down switches 414 to 416, and resistance elements 417 to 422. The driver circuit DRIVER2 may include a plurality of pull-up switches 431 to 433, a plurality of pull-down switches 434 to 436, and resistance elements 437 to 442. The pull-up switches 411 to 413 may be controlled by the pull-up signal PU1, and the pull-down switches 414 to 416 may be controlled by the pull-down signal PD1. The pull-up signal PU1 and the pull-down signal PD1 may have as many bits as the number of pull-up switches 411 to 413 and the number of pull-down switches 414 to 416, respectively. That is, on/off of each of the pull-up switches 411 to 413 may be independently controlled by the pull-up signal PD1 with multiple bits corresponding to the serialized data, and on/off of each of the pull-down switches 414 to 416 may be independently controlled by the pull-down signal PD1. Likewise, the pull-up switches 431 to 433 may be controlled by the pull-up signal PU2, and the pull-down switches 434 to 436 may be controlled by the pull-down signal PD2. Each of the pull-up switches 411, 412, 413, 431, 432 and 433 and the pull-down switches 414, 415, 416, 434, 435 and 436 may include a PMOS transistor or an NMOS transistor.

Referring to FIGS. 3 and 4 together, the parallel data DATA1<7:0> inputted to the D-PHY logic 120 in the D-PHY mode may be transmitted to the serializing block 210 together with the emphasis information EMP1 generated from the emphasis circuit 121 included in the D-PHY logic 120. In this case, the emphasis information EMP1 may be generated in an 8-bit parallel data format, and include information for adjusting the driving force of the driver when data having the same logic value is continuously outputted.

The parallel-to-serial conversion circuit SER1<1> included in the serializing block 210 may receive the parallel data DATA1<7:0> transmitted from the D-PHY logic 120, convert the parallel data DATA1<7:0> in the parallel-toserial manner, and output the output (i.e., serial data) S11. The parallel-to-serial conversion circuit SER1<0> may receive the 8-bit emphasis information EMP1 from the emphasis circuit 121, convert the emphasis information EMP1 in the parallel-to-serial manner, and output the converted emphasis information as the output S10 having a serial data format.

The multiplexer block 220 may receive the serial data S11 outputted from the parallel-to-serial conversion circuit SER1<1>, and set a data transmission path so that the driver control circuits DRVCON1 and DRVCON2 included in the driver control block 230 generate the pull-up signals PU1 and PU2 and the pull-down signals PD1 and PD2 for controlling the drivers DRIVER1 and DRIVER2 to output a pair of differential data. The multiplexer block 220 may transmit the serial data S11 transmitted from the parallel-to-serial conversion circuit SER1<1> to a positive input terminal of the driver control circuit DRVCON1, and transmit data obtained by inverting the serial data S11 to a negative input terminal of the driver control circuit DRVCON1. The multiplexer block 220 may invert the serial data S11 transmitted from the parallel-to-serial conversion circuit SER1<1>, transmit the inverted data to a positive input terminal of the driver control circuit DRVCON2, and transmit the serial data S11 to a negative input terminal of the driver control circuit DRVCON2. The multiplexer block 220 may transmit the serial emphasis information S10 received from the parallel-to-serial conversion circuit SER1<0> to each of emphasis terminals of the driver control circuits DRVCON1 and DRVCON2.

The driver control circuit DRVCON1 included in the driver control block 230 may generate the pull-up signal PU1 and the pull-down signal PD1 for controlling the driver circuit DRIVER1 included in the driver block 240, by using the data and information received through the positive input terminal, the negative input terminal and the emphasis terminal. Likewise, the driver control circuit DRVCON2 may generate the pull-up signal PU2 and the pull-down signal PD2 for controlling the driver circuit DRIVER2. As described above, each of the pull-up signals PU1 and PU2 and pull-down signals PD1 and PD2 may have multiple bits corresponding to the serialized data.

In the D-PHY mode, data may be outputted in the differential signal format, and the outputted signal may have one of two logic values, i.e., a logic high level ("H") or a logic low level ("L"). For example, when the data inputted to the positive input terminal of the driver control circuit DRVCON1 has the logic high level ("H") and the data inputted to the negative input terminal of the driver control circuit DRVCON1 has a logic low level ("L"), the logic low level data may be inputted to the positive input terminal of the driver control circuit DRVCON2, and the logic high level data may be inputted to the negative input terminal of the driver control circuit DRVCON2.

Each of the pull-up switches 411 to 413 and 431 to 433 of the driver circuits DRIVER1 and DRIVER2 may be composed of a PMOS transistor, and each of the pull-down switches 414 to 416 and 434 to 436 may be composed of an NMOS transistor. In this case, the driver control circuit DRVCON1 may output, to the driver circuit DRIVER1, the pull-up signal PU1 composed of all low bits ("L") or a large number of low bits and a small number of high bits according to the emphasis information EMP1, and output the pull-down signal PD1 composed of all low bits to the driver circuit DRIVER1. The driver control circuit DRVCON2 may output, to the driver circuit DRIVER2, the pull-up signal PU2 composed of all high bits ("H") or a large number of high bits and a small number of low bits according to the emphasis information EMP1, and output the pull-down signal PD2 composed of all high bits to the driver circuit DRIVER2. In some cases, each of the pull-up switches 411 to 413 and 431 to 433 may be composed of an NMOS transistor. In this case, levels of the pull-up signals that control the pull-up switches 411 to 413 and 431 to 433 may be opposite to levels of the pull-up signals in the case where each of the pull-up switches 411 to 413 and 431 to 433 is composed of a PMOS transistor.

When the driver circuit DRIVER1 receives, from the driver control circuit DRVCON1, the pull-up signal PU1 composed of all low bits or a large number of low bits and a small number of high bits and the pull-down signal PD2 composed of all low bits, the pull-up switches 411 to 413 each composed of the PMOS transistor may be mostly turned on, the pull-down switches 414 to 416 each composed of the NMOS transistor may be turned off, and the driver circuit DRIVER1 may finally output the logic high level data.

When the driver circuit DRIVER2 receives, from the driver control circuit DRVCON2, the pull-up signal PU2 composed of all high bits ("H") or a large number of high bits and a small number of low bits and the pull-down signal PD2 composed of all high bits, the pull-up switches 431 to 433 each composed of the PMOS transistor may be mostly turned off, the pull-down switches 434 to 436 each composed of the NMOS transistor may be turned on, and the driver circuit DRIVER2 may finally output the logic low level data.

When outputting data, the driver circuit DRIVER1 and the driver circuit DRIVER2 may adjust the driving force thereof, by changing the number of switches that are turned on according to the emphasis information EMP1. Reference symbol "TX" in FIG. 4 refers to the driver circuits' side that transmits data, and reference symbol "RX" refers to the receiving circuits' side that receives the data transmitted from the driver circuits DRIVER1 and DRIVER2. The receiving circuits' side may include resistors to terminate the output of the driver circuit DRIVER1 and the output of the driver circuit DRIVER2, which are differential signals.

Figure 5:
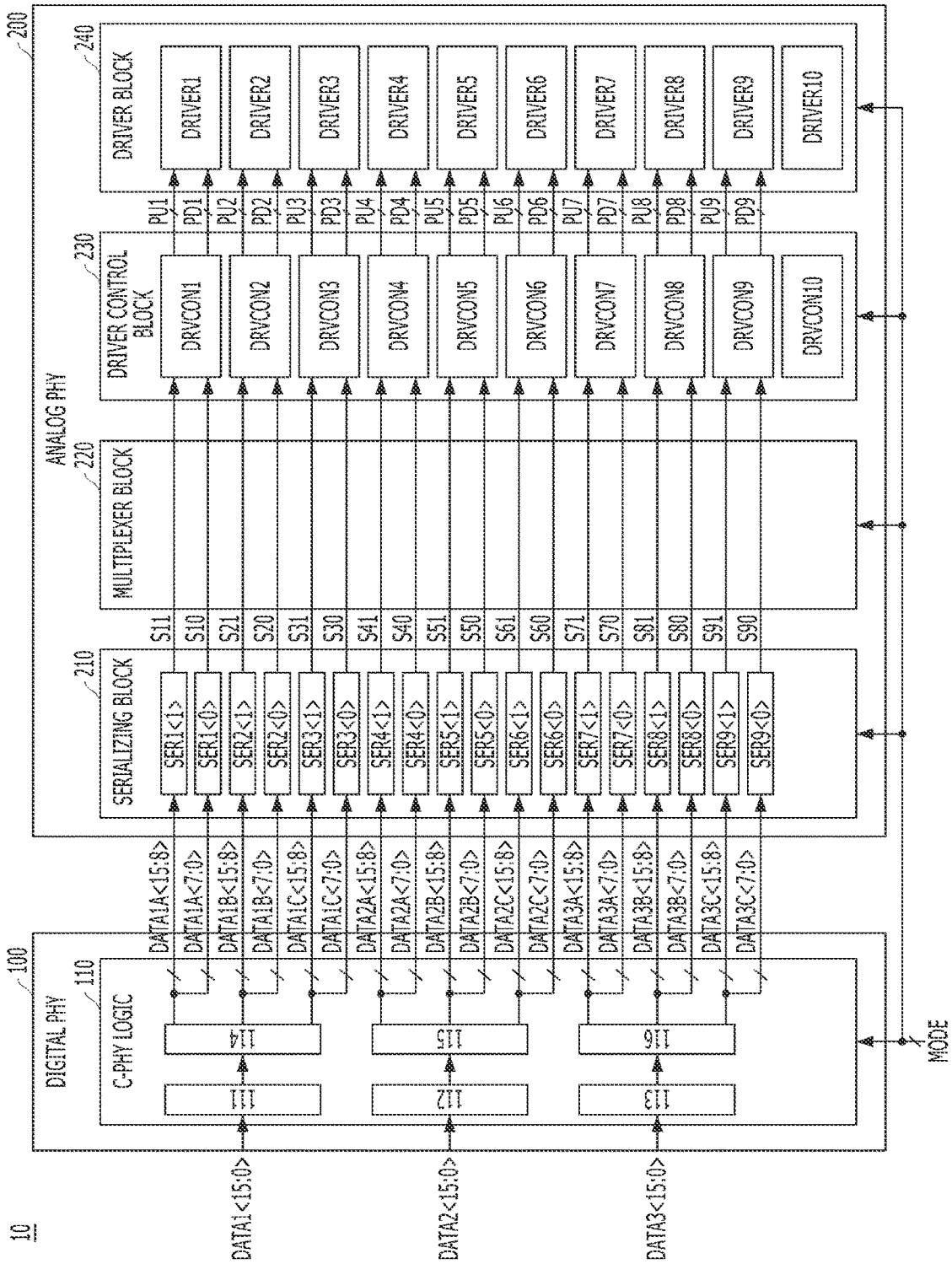
FIG. 5 is a diagram for describing a C-PHY mode operation of the interface illustrated in FIG. 2 in accordance with an embodiment of the present disclosure.

FIG. 5 is a diagram for describing a C-PHY mode operation of the interface device 10 illustrated in FIG. 2 in accordance with an embodiment of the present disclosure.

Since the D-PHY logic 120 and the test logic 130 included in the digital PHY 100 are deactivated or disabled during the C-PHY mode operation, illustrations thereof are omitted in FIG. 5.

During the C-PHY mode operation, the D-PHY logic 120 and the test logic 130 may be deactivated according to the mode information MODE.

During the C-PHY mode operation, the C-PHY logic 110 included in the digital PHY 100 may be activated according to the mode information MODE, and receive parallel data DATA1<15:0>, DATA2<15:0> and DATA3<15:0> to be outputted to an external device.

A C-PHY interface protocol may be composed of a maximum of three data lanes without a separate clock lane, and each of the data lanes may use three lines. FIG. 5 illustrates a case in which the C-PHY interface protocol is composed of three data lanes, and the number of data lanes may be greater or less than three according to embodiments.

The C-PHY logic 110 may receive the parallel data DATA1<15:0>, DATA2<15:0> and DATA3<15:0>. Each of the parallel data DATA1<15:0>, DATA2<15:0> and DATA3<15:0> may be 16-bit data to be outputted to one data lane.

The C-PHY logic 110 may include mappers 111 to 113 and encoders 114 to 116. One mapper and one encoder may correspond to each data lane. The mappers 111 to 113 may convert the respective parallel data DATA1<15:0>, DATA2<15:0> and DATA3<15:0> into 7 symbols, and transmit the 7 symbols to the respective encoders 114 to 116. Each of the encoders 114 to 116 may convert the 7 symbols into a wire state. The wire state may include six states, and determine driving levels of the three lines constituting one data lane according to each of the states. The encoders 114 to 116 may divide write state information of each line into pull-up information DATA1A<15:8>, DATA1B<15:8>, DATA1C<15:8>, DATA2A<15:8>, DATA2B<15:8>, DATA2C<15:8>, DATA3A<15:8>, DATA3B<15:8> and DATA3C<15:8> and pull-down information DATA1A<7:0>, DATA1B<7:0>, DATA1C<7:0>, DATA2A<7:0>, DATA2B<7:0>, DATA2C<7:0>, DATA3A<7:0>, DATA3B<7:0> and DATA3C<7:0>, and output the pull-up and pull-down information to the serializing block 210.

During the C-PHY mode operation, all 18 parallel-to-serial conversion circuits SER1<1> to SER9<1> and SER1<0> to SER9<0> included in the serializing block 210 may be activated. The parallel-to-serial conversion circuits SER1<1> to SER9<1> and SER1<0> to SER9<0> may convert and output the wire state information DATA1A<15:8>, DATA1B<15:8>, DATA1C<15:8>, DATA2A<15:8>, DATA2B<15:8>, DATA2C<15:8>, DATA3A<15:8>, DATA3B<15:8>, DATA3C<15:8>, DATA1A<7:0>, DATA1B<7:0>, DATA1C<7:0>, DATA2A<7:0>, DATA2B<7:0>, DATA2C<7:0>, DATA3A<7:0>, DATA3B<7:0> and DATA3C<7:0>, respectively, transmitted from the encoders 114 to 116, in a parallel-to-serial manner. For example, the parallel-to-serial conversion circuit SER1<1> may convert the pull-up information DATA1A<15:8> at a ratio of 8:1 in the parallel-to-serial manner and output the converted information, and the parallel-to-serial conversion circuit SER1<0> may convert the pull-down information DATA1A<7:0> at a ratio of 8:1 in the parallel-to-serial manner and output the converted information.

During the C-PHY mode operation, the multiplexer block 220 may set signal paths so that outputs S11, S10, S21, S20, S31, S30, S41, S40, S51, S50, S61, S60, S71, S70, S81, S80, S91 and S90 of the serializing block 210 are transmitted to the driver control block 230 as they are. That is, the multiplexer block 220 may be bypassed during the C-PHY mode operation.

During the C-PHY mode operation, 9 driver control circuits DRVCON1 to DRVCON9 among the 10 driver control circuits DRVCON1 to DRVCON10 included in the driver control block 230 may be activated, and one driver control circuit DRVCON10 may be deactivated. Each of the driver control circuits DRVCON1 to DRVCON9 may receive pull-up information and pull-down information from a pair of corresponding parallel-to-serial conversion circuits, and generate a pull-up signal and a pull-down signal for controlling a corresponding driver circuit. For example, the driver control circuit DRVCON4 may receive pull-up information S41 and pull-down information S40 outputted from the parallel-to-serial conversion circuits SER4<1> and SER4<0>, and generate a pull-up signal PU4 and a pull-down signal PD4 for controlling a driver circuit DRIVER4.

During the C-PHY mode operation, 9 driver circuits DRIVER1 to DRIVER9 among the 10 driver circuits DRIVER1 to DRIVER10 included in the driver block 240 may be activated, and one driver circuit DRIVER10 may be deactivated. The 9 activated driver circuits DRIVER1 to DRIVER9 may output data according to respective pull-up signals PU1 to PU9 and respective pull-down signals PD1 to PD9 received from the respective driver control circuits DRVCON1 to DRVCON9.

Figure 6:
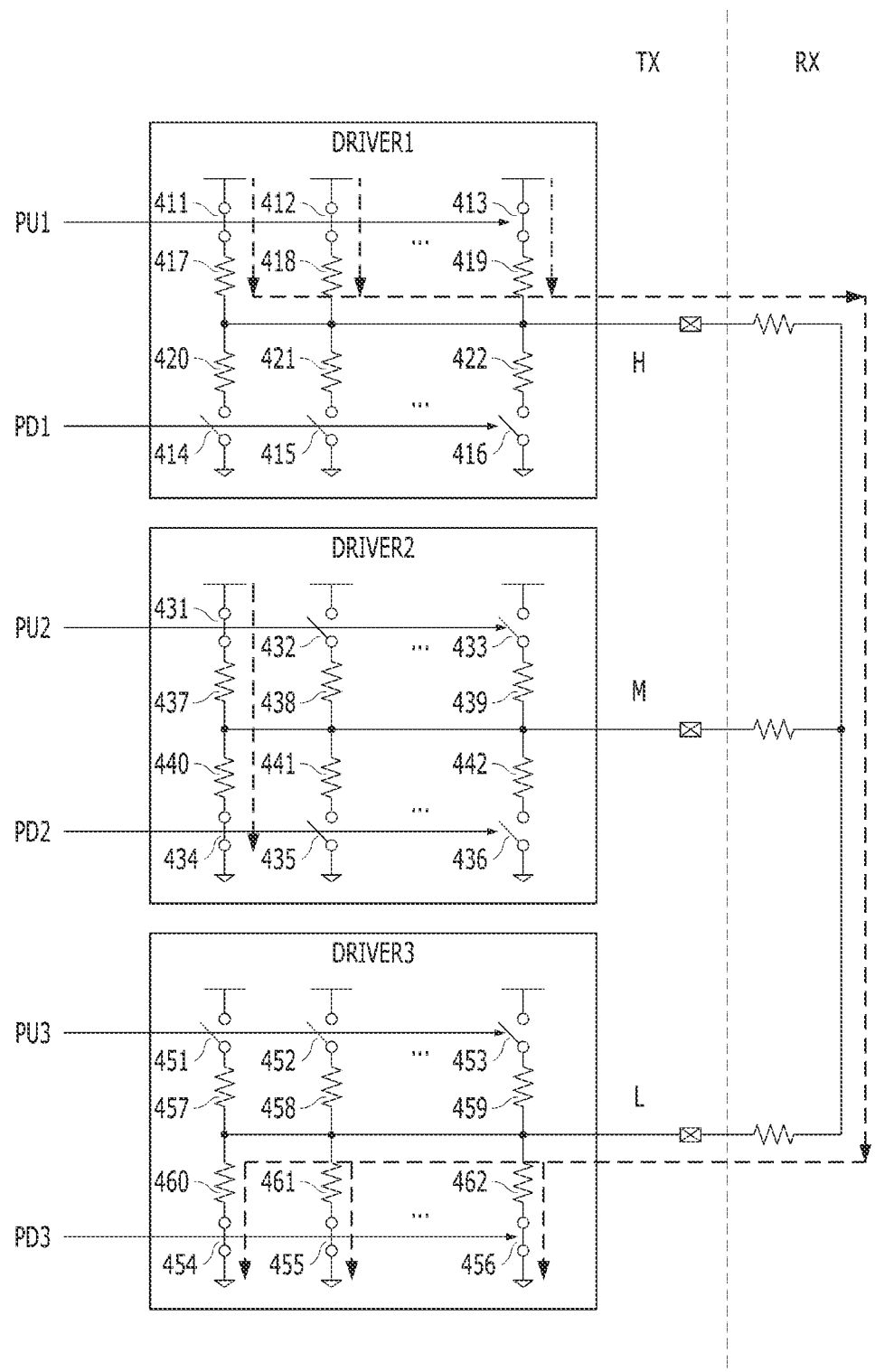
FIG. 6 is a diagram for describing an operation of the driver block in a C-PHY mode illustrated in FIG. 5 in accordance with an embodiment of the present disclosure.

FIG. 6 is a diagram for describing an operation of the driver block 240 in the C-PHY mode illustrated in FIG. 5 in accordance with an embodiment of the present disclosure.

In the C-PHY interface protocol, the outputs of the driver circuits DRIVER1 to DRIVER3 may have one of three logic values. Driving levels of three lines constituting one data lane may be determined based on the respective pull-up signals PU1 to PU3 and the respective pull-down signals PD1 to PD3 generated from the driver control circuits DRVCON1 to DRVCON3 according to the wire state outputted from the encoder 114. In the example of FIG. 6, the driver circuit DRIVER1 may output logic high level ("H") data, the driver circuit DRIVER2 may output middle ("M") data whose logic level is between logic high level data and logic low level ("L") data, and the driver circuit DRIVER3 may output logic low level data.

Each of the pull-up switches 411 to 413, 431 to 433 and 451 to 453 of the driver circuits DRIVER1, DRIVER2 and DRIVER3 may be composed of a PMOS transistor, and each of the pull-down switches 414 to 416, 434 to 436 and 454 to 456 of the driver circuits DRIVER1, DRIVER2 and DRIVER3 may be composed of an NMOS transistor. In this case, the pull-up signal PU1 composed of all low bits and the pull-down signal PD1 composed of all low bits may be inputted to the driver circuit DRIVER1. The pull-up signal PU2 composed of one low bit and the other high bits and the pull-down signal PD2 composed of one high bit and the other low bits may be inputted to the driver circuit DRIVER2. The pull-up signal PU3 composed of all high bits and the pull-down signal PD3 composed of all high bits may be inputted to the driver circuit DRIVER3. Accordingly, the pull-up switches 411 to 413 may be turned on, and the pull-down switches 414 to 416 may be turned off, and therefore, the driver circuit DRIVER1 may output the logic high level data. Only one pull-up switch 431 and one pull-down switch 434 may be turned on, and the other switches 432, 433, 435 and 436 may be turned off, and therefore, the driver circuit DRIVER2 may output the middle data. The pull-down switches 454, 455 and 456 may be turned on, and the pull-up switches 451, 452 and 453 may be turned off, and therefore, the driver circuit DRIVER3 may output the logic low level data.

Herein, it is described as an example that one pull-up switch 431 and one pull-down switch 434 are turned on when the driver circuit DRIVER2 outputs the middle data, but the number of pull-up and pull-down switches that are turned on may be different from that in this example. For example, half of the pull-up switches 431 to 433 of the driver circuit DRIVER2 may be turned on, and half of the pull-down switches 434 to 436 of the driver circuit DRIVER2 may be turned on, and therefore, the middle data may be outputted from the driver circuit DRIVER2.

Figure 7:
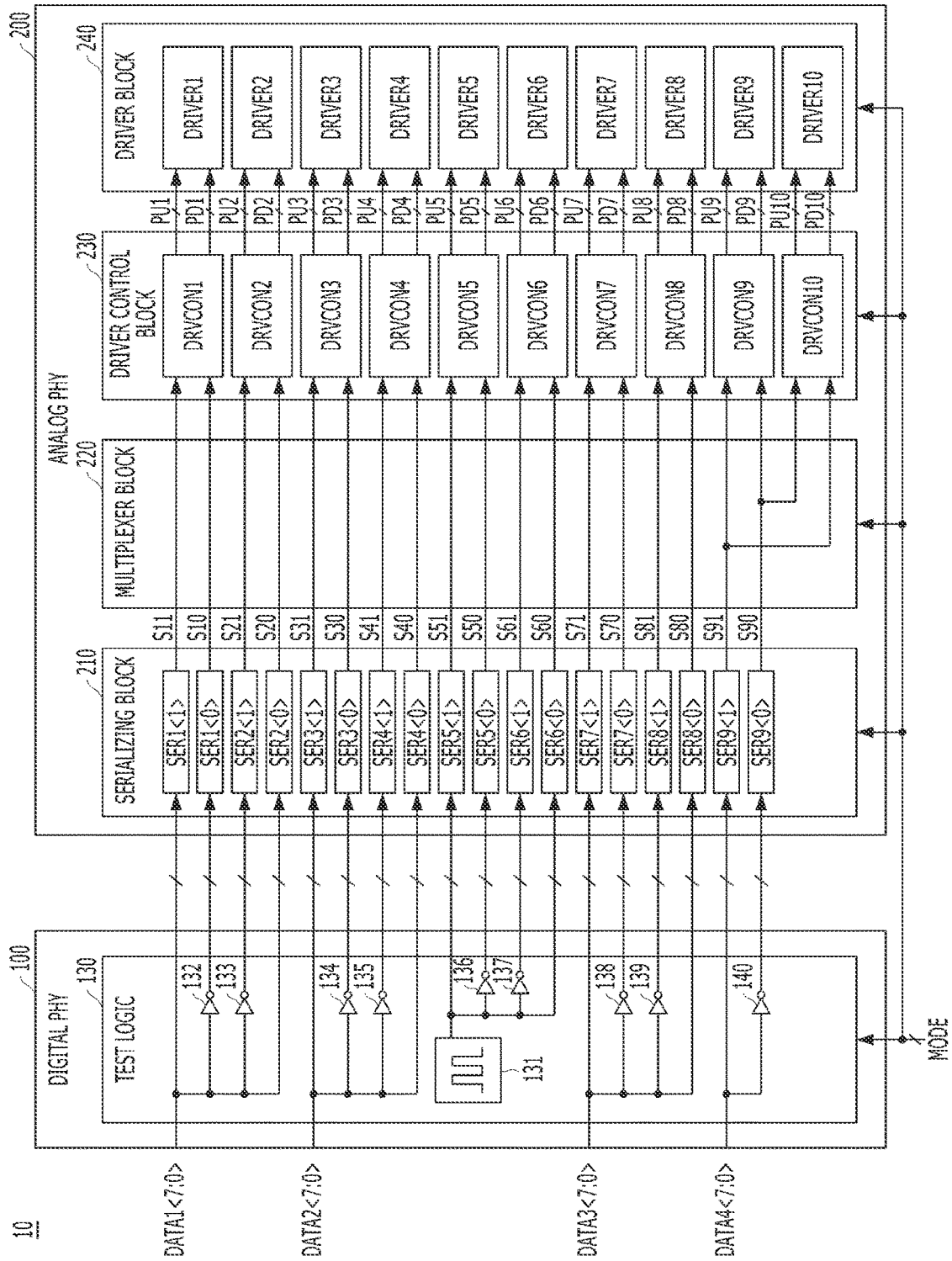
FIG. 7 is a diagram for describing a test mode operation according to the interface illustrated in FIG. 2 in accordance with an embodiment of the present disclosure.

FIG. 7 is a diagram for describing a test mode operation according to the interface device 10 illustrated in FIG. 2 in accordance with an embodiment of the present disclosure.

Since the D-PHY logic 120 and the C-PHY logic 110 included in the digital PHY 100 are deactivated or disabled during the test mode operation, illustrations thereof are omitted in FIG. 7.

During the test mode operation, the D-PHY logic 120 and the C-PHY logic 110 may be deactivated according to the mode information MODE.

During the test mode operation, the test logic 130 included in the digital PHY 100 may be activated according to the mode information MODE, and receive parallel data DATA1<7:0>, DATA2<7:0>, DATA3<7:0> and DATA4<7:0> to be outputted to an external device.

During the test mode operation, all circuits included in the analog PHY 200 may be used to operate to output data through a D-PHY interface protocol.

The test logic 130 may receive the four parallel data DATA1<7:0> to DATA4<7:0> as in the D-PHY mode operation. Each of the parallel data DATA1<7:0>, DATA2<7:0>, DATA3<7:0> and DATA4<7:0> may be outputted to a corresponding data lane. The test logic 130 may set signal paths to output each of the parallel data DATA1<7:0>, DATA2<7:0>, DATA3<7:0> and DATA4<7:0> through a pair of driver circuits as a differential signal.

The test logic 130 may include a clock pattern generation circuit 131 for outputting a clock signal (i.e., a clock pattern corresponding to parallel data, which serves as a part of a test parallel data pattern). The test logic 130 may further include inverters 132 to 140 for inverting the parallel data and the clock signal. Each of the inverters 132 to 140 illustrated in the figure may represent 8 inverters. For example, the inverter 133 may represent 8 inverters for inverting the 8-bit parallel data DATA1<7:0>.

During the test mode operation, the test logic 130 may receive the parallel data DATA1<7:0>, transmit the parallel data DATA1<7:0> to parallel-to-serial conversion circuits SER1<1> and SER2<0> without inverting the parallel data DATA1<7:0>, and transmit inverted parallel data to parallel-to-serial conversion circuits SER1<0> and SER2<1>. The parallel data DATA1<7:0> transmitted to the parallel-to-serial conversion circuit SER1<1> may be used to generate output (i.e., serial data) S11 to be inputted to a positive input terminal of a driver control circuit DRVCON1, and serial data S10 outputted from the parallel-to-serial conversion circuit SER1<0> may be inputted to a negative input terminal of the driver control circuit DRVCON1. Serial data S21 outputted from the parallel-to-serial conversion circuit SER2<1> may be inputted to a positive input terminal of a driver control circuit DRVCON2, and serial data S20 outputted from the parallel-to-serial conversion circuit SER2<0> may be inputted to a negative input terminal of the driver control circuit DRVCON2.

During the test mode operation, the test logic 130 may receive the parallel data DATA4<7:0>, transmit the parallel data DATA4<7:0> to a parallel-to-serial conversion circuit SER9<1> without inverting the parallel data DATA4<7:0>, and transmit inverted parallel data to the parallel-to-serial conversion circuit SER9<0>. Since the number of parallel-to-serial conversion circuits SER1<1> to SER9<1> and SER1<0> to SER9<0> included in the serializing block 210 is 18, one of data and clock lanes may be connected to only two parallel-to-serial conversion circuits.

During the test mode operation, all 18 parallel-to-serial conversion circuits SER1<1> to SER9<1> and SER1<0> to SER9<0> included in the serializing block 210 may be activated, and the test parallel data pattern received from the test logic 130 may be converted in a parallel-to-serial manner, and the converted data may be outputted to the multiplexer block 220. The test parallel data pattern includes inverted and non-inverted parallel data DATA1<7:0>, DATA2<7:0>, DATA3<7:0> and DATA4<7:0>, and the clock pattern generated from the clock pattern generation circuit 131.

During the test mode operation, the multiplexer block 220 is configured to transmit serial data S11, S10, S21, S20, S31, S30, S41, S40, S51, S50, S61, S60, S71, S70, S81, S80, S91 and S90 outputted from the parallel-to-serial conversion circuits SER1<1> to SER9<1> and SER1<0> to SER9<0> to the driver control block 230. In this case, the serial data S91 outputted from the parallel-to-serial conversion circuit SER9<1> and the serial data S90 outputted from the parallel-to-serial conversion circuit SER9<0> may be simultaneously transmitted to driver control circuits DRVCON9 and DRVCON10, respectively. Since the number of parallel-to-serial conversion circuits SER1<1> to SER9<1> and SER1<0> to SER9<0> is 18, and the number of driver control circuits DRVCON1 to DRVCON10 is 10, a pair of parallel-to-serial circuits SER9<0> and SER9<1> may transmit the serial data S91 and S90 to the two driver control circuits DRVCON9 and DRVCON10, respectively.

During the test mode operation, all 10 driver control circuits DRVCON1 to DRVCON10 included in the driver control block 230 may be activated. The driver control circuits DRVCON1 to DRVCON10 may generate respective pull-up signals PU1 to PU10 and respective pull-down signals PD1 to PD10 according to the serial data inputted to respective positive input terminals and respective negative input terminals thereof, and output the generated pull-up and pull-down signals to the driver block 240.

During the test mode operation, all parallel-to-serial conversion circuits SER1<1> to SER9<1> and SER1<0> to SER9<0> of the serializing block 210 may operate, all driver control circuits DRVCON1 to DRVCON10 of the driver control block 230 may operate, and all driver circuits DRIVER1 to DRIVER10 of the driver block 240 may operate. That is, all circuits and data paths of the analog PHY 200 may operate and be tested. Accordingly, it may be possible to verify the operations of all circuits and data paths included in the analog PHY 200 during the test mode operation.

Figure 8:
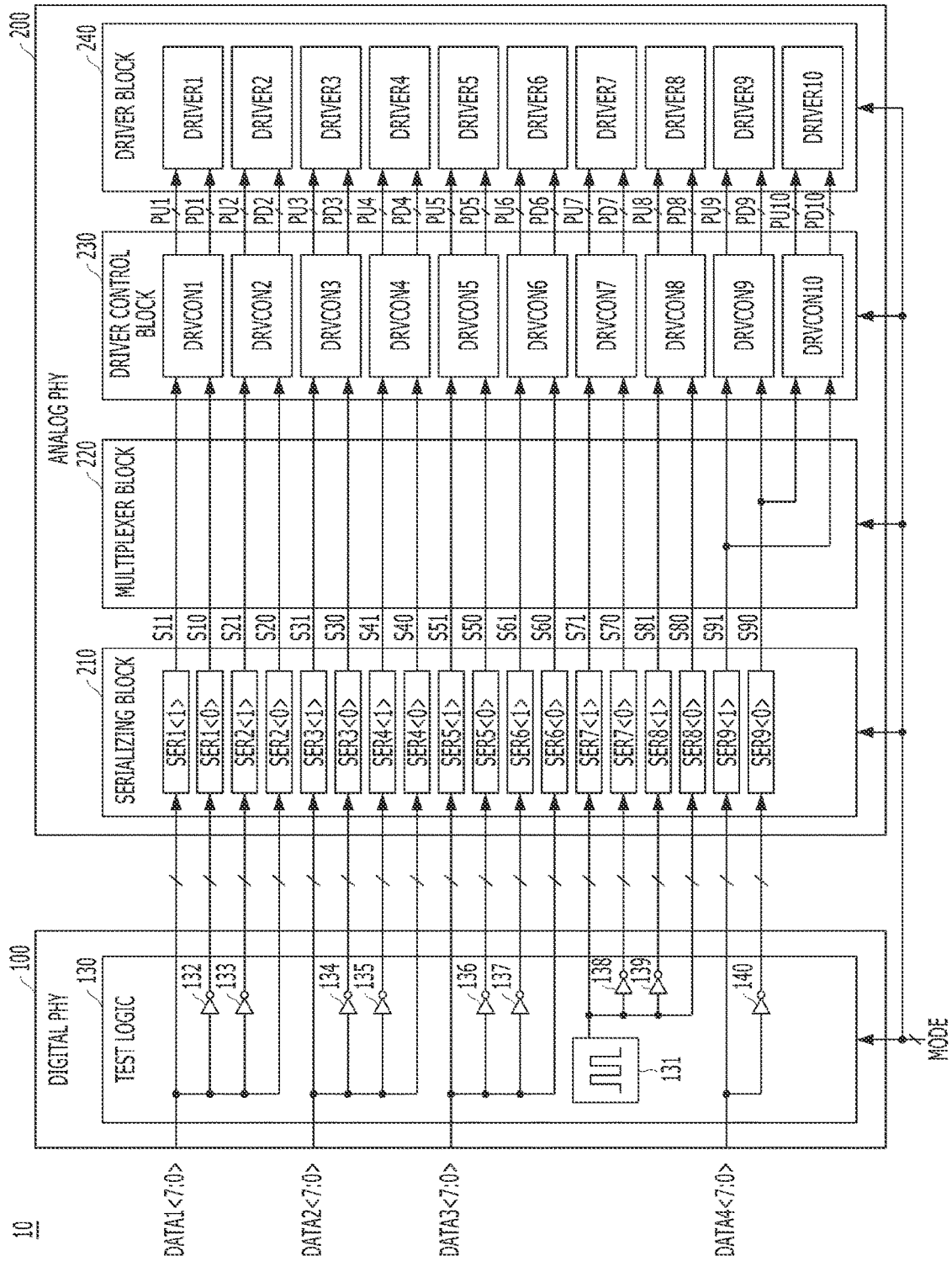
FIG. 8 is a diagram illustrating the test mode operation illustrated in FIG. 7 in accordance with another embodiment of the present disclosure.

FIG. 8 is a diagram illustrating the test mode operation illustrated in FIG. 7 in accordance with an embodiment of the present disclosure.

FIG. 8 illustrates an example in which the clock lane and the parallel data DATA3<7:0> may be tested by changing locations thereof during the test mode operation.

In order to generate an 8-bit parallel signal in which a low bit or a high bit are repeated, in the clock pattern generation circuit 131, the high bit or the low bit may be fixed and connected according to bit locations. When fixed levels are the same as levels that are fixedly outputted from the clock pattern generation circuit 131 even though defects in which some of inputs of parallel-to-serial conversion circuits that receive outputs of the clock pattern generation circuit 131 are fixed to the high bit or the low bit occur, the defects may not be detected during the test mode operation.

The defects may be detected during the test mode operation, by repeatedly performing test operations while changing the location of the clock lane with one of data lanes.

According to embodiments of the present disclosure, it is possible to provide a test mode circuit that allows an interface device supporting two or more different interface protocols to test, by using one interface protocol, signal paths and circuits used by other interface protocols, which makes it possible to test the signal paths and circuits used by other interface protocols at once only with test equipment supporting one interface protocol.

While the present disclosure has been illustrated and described with respect to specific embodiments, the disclosed embodiments are provided for the description, and not intended to be restrictive. Further, it is noted that the present disclosure may be achieved in various ways through substitution, change, and modification that fall within the scope of the following claims, as those skilled in the art will recognize in light of the present disclosure. Therefore, the scope of the present disclosure encompasses all variations that fall within the scope of the claims including their equivalents. Furthermore, the embodiments may be combined to form additional embodiments.

What is claimed is:

1. An interface device comprising:
    a first parallel-to-serial conversion circuit suitable for converting inverted parallel data in a parallel-to-serial manner to generate first output data in a test mode;
    a second parallel-to-serial conversion circuit suitable for converting non-inverted parallel data in the parallel-to-serial manner to generate second output data in the test mode;
    a third parallel-to-serial conversion circuit suitable for converting the non-inverted parallel data in the parallel-to-serial manner to generate third output data in the test mode;
    a fourth parallel-to-serial conversion circuit suitable for converting the inverted parallel data in the parallel-to-serial manner to generate fourth output data in the test mode;
    a first driver circuit suitable for receiving the first and second output data in the test mode; and
    a second driver circuit suitable for receiving the third and fourth output data in the test mode.

2. The interface device of claim 1, wherein outputs of the first and second driver circuits each have a level corresponding to one of two logic values in the test mode.

3. The interface device of claim 1, further comprising:
    a fifth parallel-to-serial conversion circuit suitable for converting an inverted clock pattern in the parallel-to-serial manner to generate a first clock pattern data in the test mode;
    a sixth parallel-to-serial conversion circuit suitable for converting a non-inverted clock pattern in the parallel-to-serial manner to generate a second clock pattern data in the test mode;
    a seventh parallel-to-serial conversion circuit suitable for converting the non-inverted clock pattern in the parallel-to-serial manner to generate a third clock pattern data in the test mode;
    an eighth parallel-to-serial conversion circuit suitable for converting the inverted clock pattern in the parallel-to-serial manner to generate a fourth clock pattern data in the test mode;
    a third driver circuit suitable for receiving the first and second clock pattern data; and
    a fourth driver circuit suitable for receiving the third and fourth clock pattern data.

4. The interface device of claim 3, wherein, in the test mode, the parallel data outputted from the first to fourth parallel-to-serial conversion circuits and the first and second driver circuits, and the clock pattern data outputted from the fifth to eighth parallel-to-serial conversion circuits and the third and fourth driver circuits are interchangeable.

5. The interface device of claim 1, wherein, in a first interface mode:
    the first parallel-to-serial conversion circuit converts the parallel data in the parallel-to-serial manner,
    the first driver circuit non-inverts and outputs a parallel-to-serial conversion result of the first parallel-to-serial conversion circuit, and
    the second driver circuit inverts and outputs the parallel-to-serial conversion result of the first parallel-to-serial conversion circuit.

6. The interface device of claim 5, further comprising an emphasis circuit suitable for generating emphasis information by using the parallel data, in the first interface mode,
    wherein, in the first interface mode, the second parallel-to-serial conversion circuit converts the emphasis information in the parallel-to-serial manner, and a parallel-to-serial conversion result of the second parallel-to-serial conversion circuit is used to control a driving force of the first and second driver circuits.

7. The interface device of claim 5, wherein the third and fourth parallel-to-serial conversion circuits are deactivated in the first interface mode.

8. The interface device of claim 5, wherein, in the first interface mode, outputs of the first and second driver circuits each have a level corresponding to one of two logic values.

9. The interface device of claim 1, wherein, in a second interface mode, the first driver circuit receives the parallel-to-serial conversion results outputted from the first and second parallel-to-serial conversion circuits, and outputs a level corresponding to one of three logic values.

10. An interface device supporting first and second interface protocols, the interface device comprising:
    a digital physical layer (PHY) configured to receive parallel data; and
    an analog PHY configured to provide the parallel data transmitted from the digital PHY with different serialized data paths corresponding to first and second operation modes,
    wherein the digital PHY includes:
    a first PHY logic configured to modify the received parallel data according to the first interface protocol, in the first operation mode;
    a second PHY logic configured to modify the received parallel data according to the second interface protocol, in the second operation mode; and
    a test logic configured to receive, in a test mode, the parallel data according to the first interface protocol, and supply all data paths in the analog PHY with a test parallel data pattern, the all data paths including at least a data path which is only used in the second operation mode.

11. The interface device of claim 10, wherein the test logic includes:
    a plurality of inverters configured to invert, in the test mode, the parallel data; and
    a clock pattern generation circuit configured to generate, in the test mode, a clock pattern serving as a part of the test parallel data pattern.

12. The interface device of claim 10, wherein the first interface protocol is D-PHY and the second interface protocol is C-PHY.

13. The interface device of claim 10, wherein the analog PHY includes:
    a serializing block configured to convert the parallel data received from the digital PHY in a parallel-to-serial manner;
    a multiplexer block configured to transmit serial data received from the serializing block through a path selected according to a current mode of the first operation mode, the second operation mode, and the test mode;
    a driver control block configured to generate a control signal according to the serial data; and a driver block configured to output the serial data according to the control signal.

\* \* \* \* \*